(12) United States Patent
Brintzinger et al.

(10) Patent No.: US 6,495,901 B2
(45) Date of Patent: Dec. 17, 2002

(54) MULTI-LEVEL FUSE STRUCTURE

(75) Inventors: Axel Christoph Brintzinger, Fishkill, NY (US); Chandrasekhar Narayan, Hopewell Junction, NY (US); David Lachtrupp, Waterbury Ctr., VT (US); Kenneth Arndt, Roselle, IL (US)

(73) Assignees: Infineon Technologies AG, Munich (DE); International Business Machines Corporation, Armonk, NY (US)

(*) Notice: Subject to any disclaimer, the term of this patent is extended or adjusted under 35 U.S.C. 154(b) by 0 days.

(21) Appl. No.: 09/772,377

(22) Filed: Jan. 30, 2001

(65) Prior Publication Data

US 2002/0100956 A1 Aug. 1, 2002

(51) Int. Cl.⁷ .......................... H01L 23/48; H01L 23/52
(52) U.S. Cl. .................. 257/529; 257/774; 257/775
(58) Field of Search .................. 257/529, 774, 257/775, 776

(56) References Cited

U.S. PATENT DOCUMENTS

| | | | |
|---|---|---|---|
| 4,714,949 A | * | 12/1987 | Simmons et al. |
| 5,389,814 A | * | 2/1995 | Srikrishnan et al. |
| 5,661,323 A | * | 8/1997 | Choi et al. |
| 5,895,962 A | * | 4/1999 | Zheng et al. |
| 5,899,736 A | | 5/1999 | Weigand et al. |
| 5,949,127 A | * | 9/1999 | Lien et al. |
| 6,008,523 A | | 12/1999 | Narayan et al. |
| 6,037,648 A | | 3/2000 | Arndt et al. |
| 6,040,615 A | * | 3/2000 | Nagai et al. |
| 6,265,778 B1 | * | 7/2001 | Tottori |

* cited by examiner

Primary Examiner—Stephen D. Meier
(74) Attorney, Agent, or Firm—Stanton Braden (57) ABSTRACT

A semiconductor device has a first conductor and a second conductor for fuse terminals. A fuse portion is disposed on a different level relative to both the first conductor and the second conductor. A first contact connects the fuse portion to the first conductor, and a second contact connects the fuse portion to the second conductor.

16 Claims, 10 Drawing Sheets

MULTI-LEVEL FUSE STRUCTURE

BACKGROUND

1. Technical Field

This disclosure relates to semiconductor devices and fabrication methods, and more particularly, to multilevel fuse structures and fabrication methods.

2. Description of the Related Art

Semiconductor devices include on-chip integrated circuits. These integrated circuits may include fuses. Fuses are employed on a semiconductor device to enable or disable portions of a circuit. Fuses are typically classified as two types: laser blown and electrical fuses. Both laser blown and electrical fuses are typically located near the surface of the semiconductor device so that fuses can be blown without damage to underlying integrated circuits. As chip density increases, however, the distance between fuses (fuse pitch) is forced to become smaller. When a fuse is blown, damage may be caused to neighboring fuses or wires.

Figure 1A:
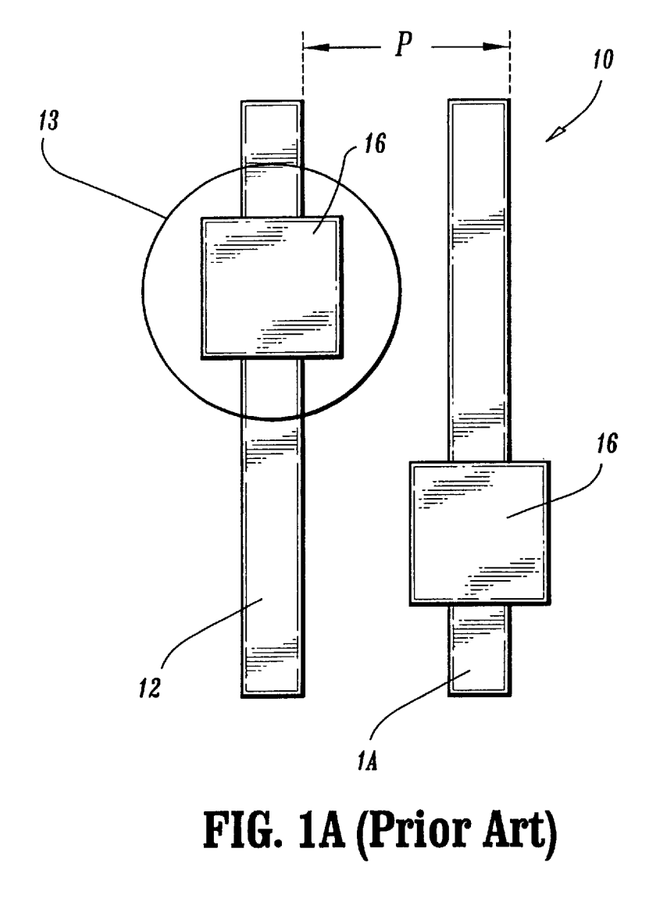
FIGS. 1A and 1B are top layout views of conventional fuse layouts with fuses on a same level as fuse terminals.
Figure 1B:
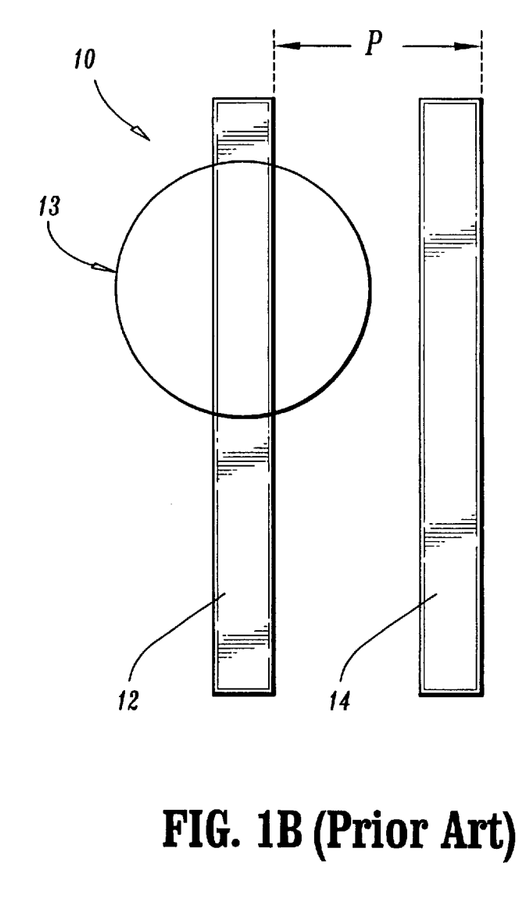

Referring to FIGS. 1A and 1B, a semiconductor layout 10 shows two laser blowable fuses 12 and 14 adjacent to one another. Fuses 12 and 14 of FIG. 1A each include a thermal pad 16, which melts from laser heat to open a fuse. For lower fuse pitches (P), a laser beam 13 aimed at fuse 12 could cause damage to fuse 14. Damage to fuse 14 may also be caused when fuse 12 is blown or due to cracks, which may propagate to fuse 14 as a result of the blowing process.

Therefore, a need exists for a fuse structure and method for fabrication, which provides for smaller spacing between fuses and protects neighboring fuses when a fuse is blown.

SUMMARY OF THE INVENTION

A semiconductor device has a first conductor and a second conductor for fuse terminals. A fuse portion is disposed on a different level relative to both the first conductor and the second conductor. A first contact connects the fuse portion to the first conductor, and a second contact connects the fuse portion to the second conductor.

In other embodiments, the fuse portion may include tungsten. The first conductor may be disposed on a different level than the second conductor. The fuse portion may be disposed in a terminal via window. The fuse portion may include a thermal pad.

Another semiconductor device of the present invention includes a plurality of fuses disposed in a fuse region. Each fuse includes a first conductor, a second conductor, and a fuse portion disposed on a different level relative to both the first conductor and the second conductor. A first contact connects the fuse portion to the first conductor, and a second contact connects the fuse portion to the second conductor wherein each fuse portion is offset from adjacent fuse portions.

In other embodiments, the fuse portion preferably includes tungsten. The first conductors are preferably disposed on a different level than the second conductors. The fuse portions may be disposed in a terminal via window. Each fuse portion may be next to one of the first conductor and the second conductor of adjacent fuses, and each fuse portion may be disposed on a different level than the one of the first conductor and the second conductor of adjacent fuses. The fuse portions may be formed on a plurality of different levels. The plurality of different levels may include two and the fuse portions may alternate between the two different levels. The fuse portions may include a thermal pad.

Another semiconductor device of the present invention, includes a plurality of fuses disposed within a terminal via window. Each fuse includes a first conductor, a second conductor disposed on a level different from the first conductor, and a fuse portion disposed on a same level as the first conductor and connected to the first conductor. A first contact connects the fuse portion to the second conductor wherein every other fuse portion is offset to an opposite side of the terminal view from adjacent fuse portions, and every other fuse portion is adjacent to the second conductor of an adjacent fuse. In other embodiments, the fuse portion preferably includes tungsten. The fuse portion may include a thermal pad.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides fuse structures and methods for fabricating the fuses structures to ensure minimal damage to neighboring fuses when a fuse is blown. The present invention will illustratively be described in terms of laser blown fuses; however, the present invention is applicable to electrical fuses as well. The present invention employs multiple level fuses. The multiple level fuses include a fuse portion and fuse connections on different levels of a chip structure. In a preferred embodiment, the fuse portions are staggered to further prevent damage to adjacent fuse portions during a fuse blow operation. The present invention is particularly useful for memory devices, such as dynamic random access memories (DRAM). The present invention is also useful for other types of semiconductor devices, such as, embedded DRAM, processors, application specific chips, etc.

Figure 2:
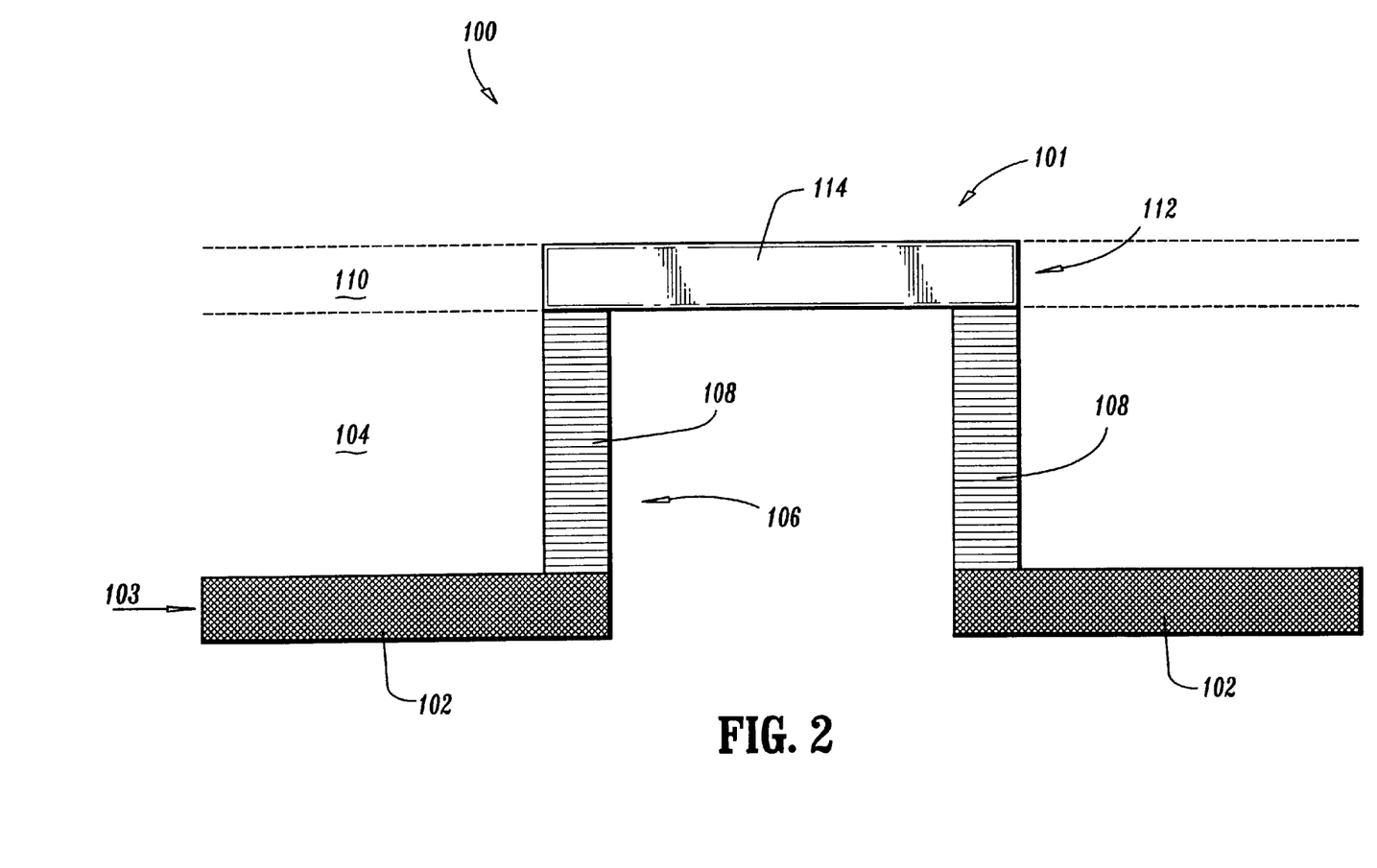
FIG. 2 is a cross-sectional view of one embodiment of the present invention showing fuse terminals and a fuse portion on different levels.

Referring now in specific detail to the drawings in which like reference numerals identify similar or identical elements throughout the several views, and initially to FIG. 2, a cross-sectional view of a fuse structure 101 for a semiconductor device 100 is shown in accordance with one embodiment of the present invention. Fuse connections 102 are formed on a layer 103 of device 100. Connections or fuse terminals 102 include a conductive material, such as a metal, preferably tungsten, aluminum, copper or any other conductive material, such as, for example, doped polysilicon. Connections 102 may include conductive lines, conductive regions, such as diffusion regions, plates or device components.

After patterning connections 102, for example, by a lithographic patterning process, a dielectric layer 104. Dielectric layer 104 is deposited over connections 102. Dielectric layer 104 preferably includes an oxide, such as silicon dioxide. Other dielectric materials may be employed as well. For example, nitride or organic dielectrics may be employed. Dielectric layer 104 is patterned to form contact holes 106 therein. Contact holes 106 are opened up down to connections 102. Connections 102 are exposed such that a contact 108 lands thereon to permit an electrical connection to be made between connections 102 and contacts 108. Contacts 108 include a conductive material, such as tungsten, aluminum, copper or any other conductive material, such as, for example, doped polysilicon.

A fuse portion 116 is patterned between contacts 108. Fuse portion 116 includes material, which absorbs laser radiation to melt or explode to cause an open circuit between terminals 102. The amount of irradiation and time needed to blow the fuse may be determined be methods known to those skilled in the art.

Another dielectric layer 110 is deposited and patterned to form a trench 112 therein down to dielectric layer. Dielectric layer 110 preferably includes an oxide, such as silicon dioxide. Other dielectric materials may be employed as well. For example, nitride or organic dielectrics may be employed. Trench 112 extends over contacts 108 and exposes contacts to permit a conductive material of fuse 114 to be in electrical contact with contacts 108. Conductive material of fuse 114 is deposited in trench 112 and on the surface of dielectric layer 110 (not shown). A planarization process, such as a chemical mechanical polish (CMP) process is employed to planarize conductive material of fuse 114 to confine the conductive material of fuse 114 to trench 112 to form fuse 114 in accordance with the present invention. In one embodiment of the present invention, conductive material of fuse 114 includes tungsten ,or other conductive material, which provides corrosion resistance to air or moisture. If such a material is employed for fuse 114, fuse 114 may be left exposed (e.g., no passivation layer is needed). Potential corrosion can be stopped because materials like tungsten provide no corrosion issues at low temperatures.

Figure 3:
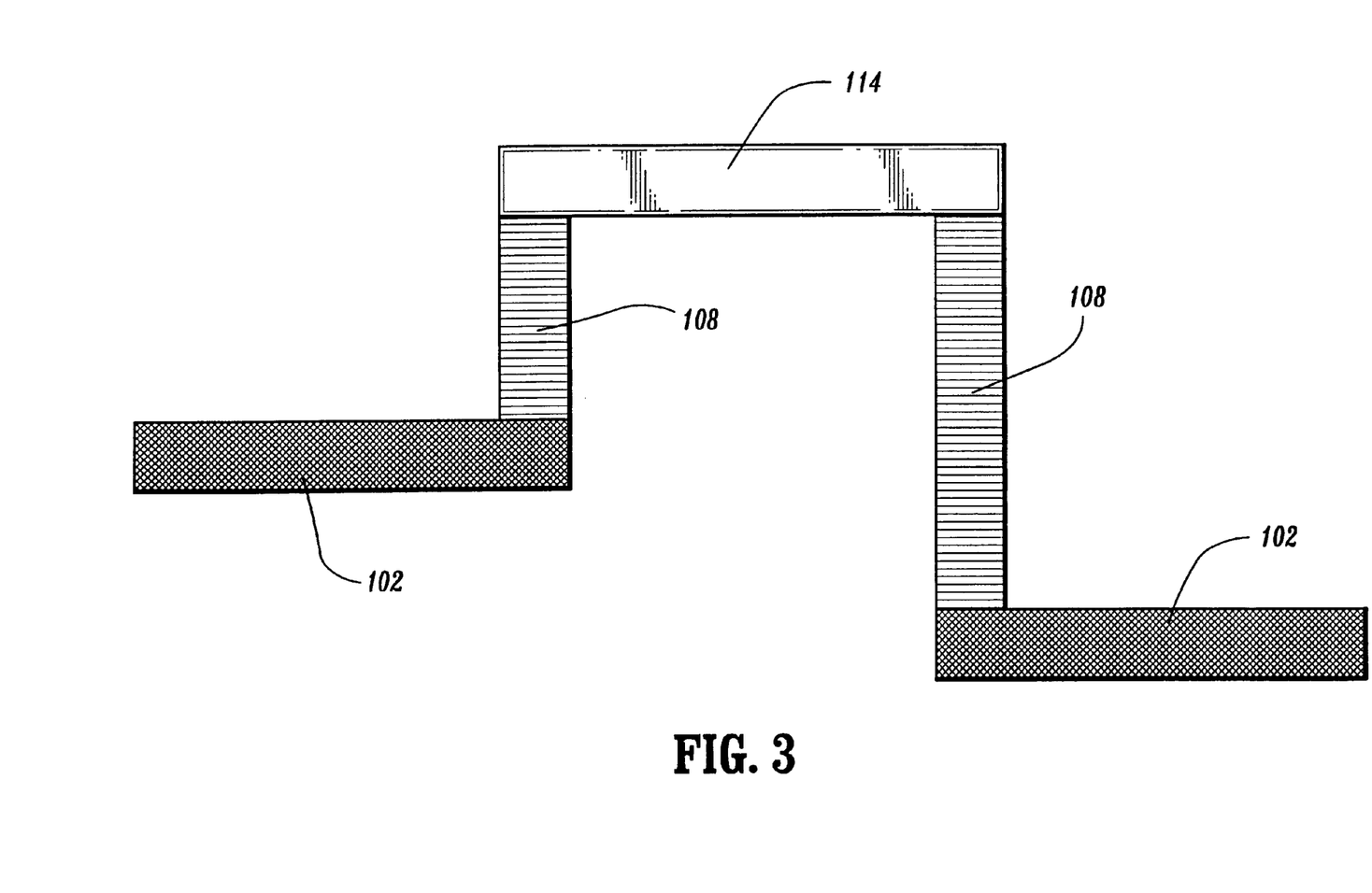
FIG. 3 is a cross-sectional view of another embodiment of the present invention showing fuse terminals on different levels.

Advantageously, fuse 114 is located on a different level of the structure than connections 102. In another embodiment, connections 102 may be formed on different levels of the structure as well, as shown in FIG. 3.

Figure 4A:
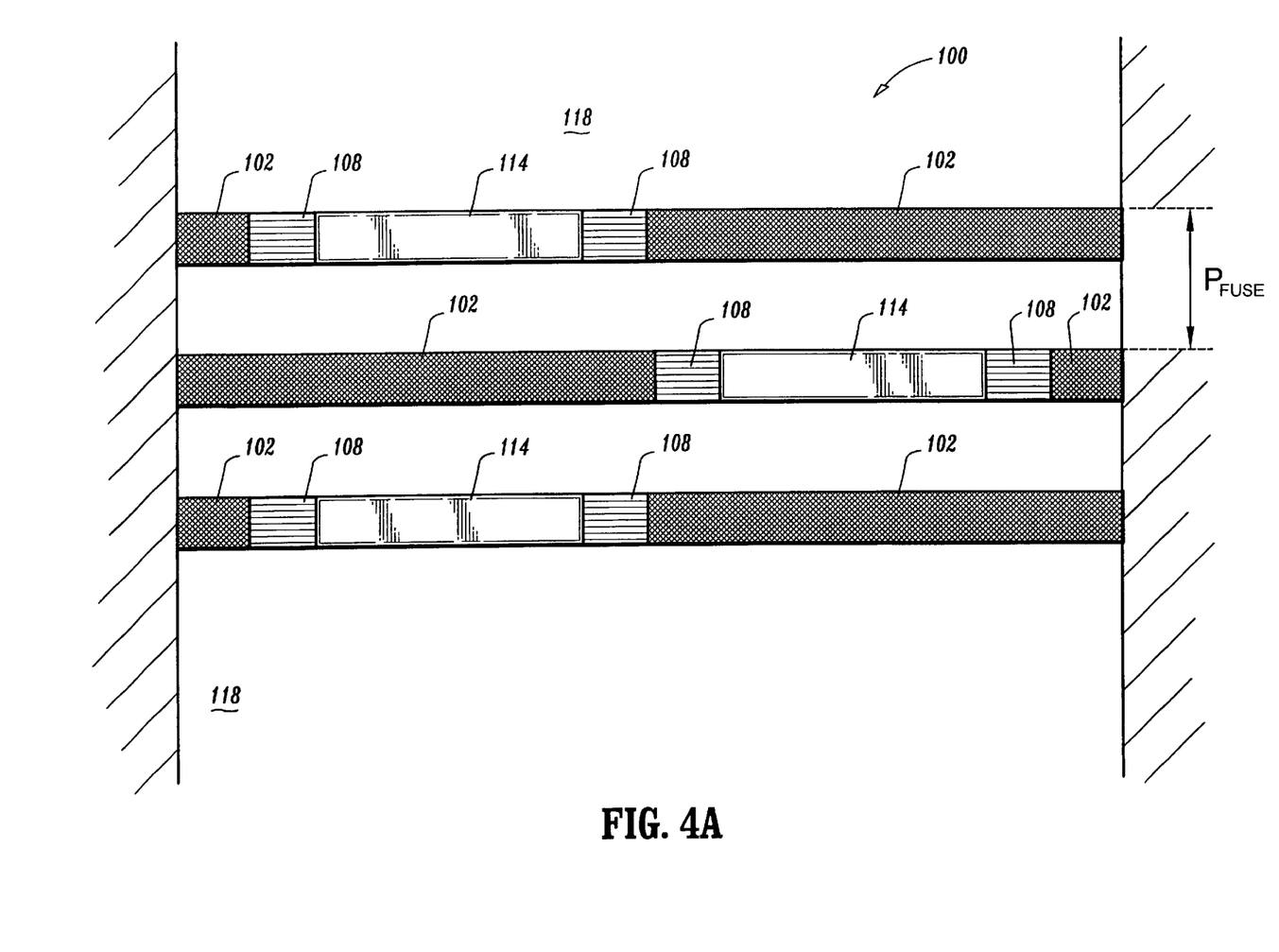
FIGS. 4A and 4B are a top layout views of the embodiments shown in either of FIGS. 2 and 3 showing fuse terminals and a fuse portion on different levels.
Figure 4B:
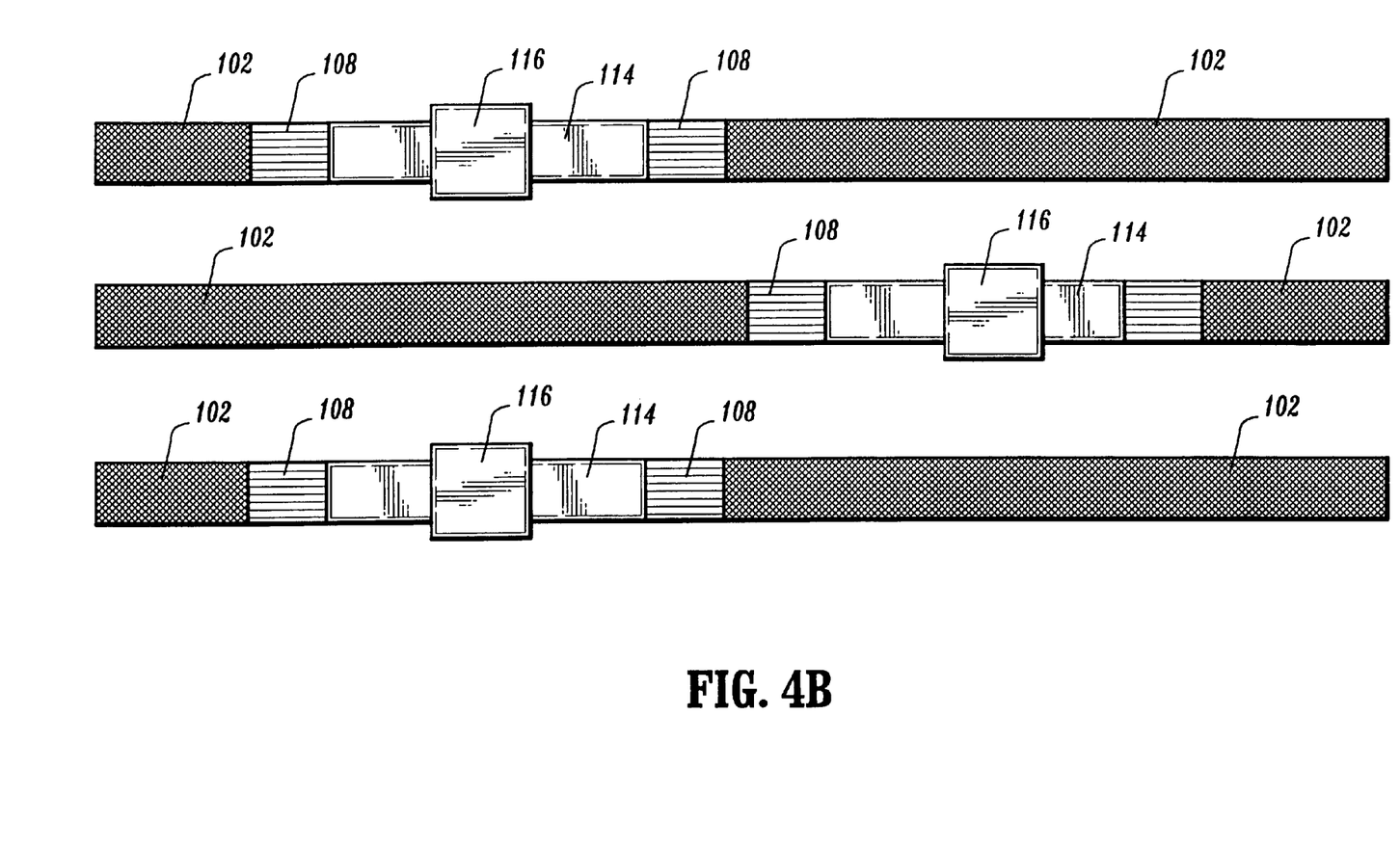

Referring to FIG. 4A, a top view of semiconductor 100 is shown with dielectric layers 104 and 110, if present, transparent to show the underlying structure. In addition, contacts 108 are shown through fuse 114 for better understanding of the FIGS. As shown in FIG. 4A, fuses 114 are staggered in an alternating pattern to ensure a larger distance between fuses 114. In one embodiment, fuses 114 are formed within a terminal via (TV) window 118. TV window 118 is an opening formed on semiconductor chips to provide access to devices on a chip, such as fuses and thermal pads 116 (FIG. 4B). TV window 118 is limited in space, as is typical for TV windows. Therefore, fuses 114 are to be placed as close as possible. Fuse pitch $P_{fuse}$ may be, for example, between about 3.0 microns and about 1.0 micron for 0.10 micron technology devices. This leaves very little leeway for a laser spot to blow the fuse without possible damage to neighboring fuses. Advantageously, terminals 102 are formed on a different layer than fuse portions 114. FIG. 4B shows an embodiment of the present invention, which employs thermal pads or bulges 116 for blowing fuses 114. Thermal pads 116 are located in a region of the fuse that is to be blown.

Figure 5:
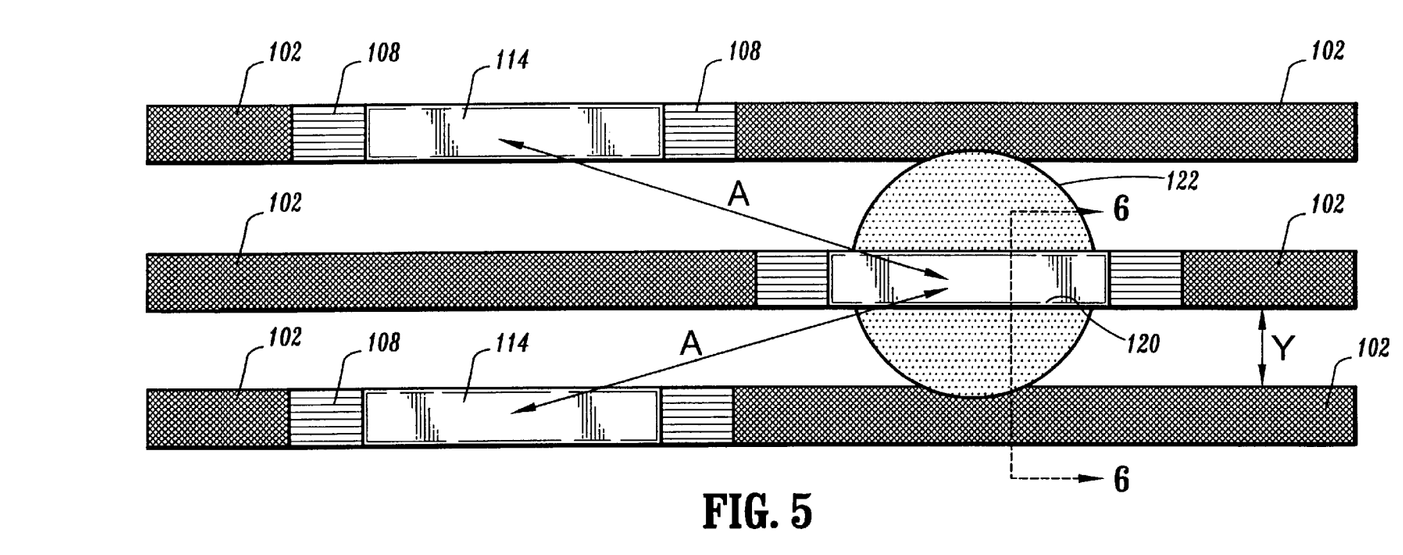
FIG. 5 is a top layout view of the embodiment shown in either of FIG. 4 showing a laser beam programming a fuse in accordance with the present invention.

Referring to FIG. 5, the layout of FIG. 4A is illustratively shown having a laser spot 122 for blowing a fuse 120. Laser spot 122 is the cross-section of a focused laser beam employed for blowing fuses. Although spot 122 seems to overlap adjacent connections 102, adjacent connections 102 are located on a different layer and are safe from damage which may have normally occurred as a result of being irradiated by laser beam 122. Even after fuse 120 blows, adjacent fuse portions 114 are diagonally offset (see arrows "A") so that a greater distance is provided between the blown fuse 120 and adjacent fuse portions 114.

Figure 6:
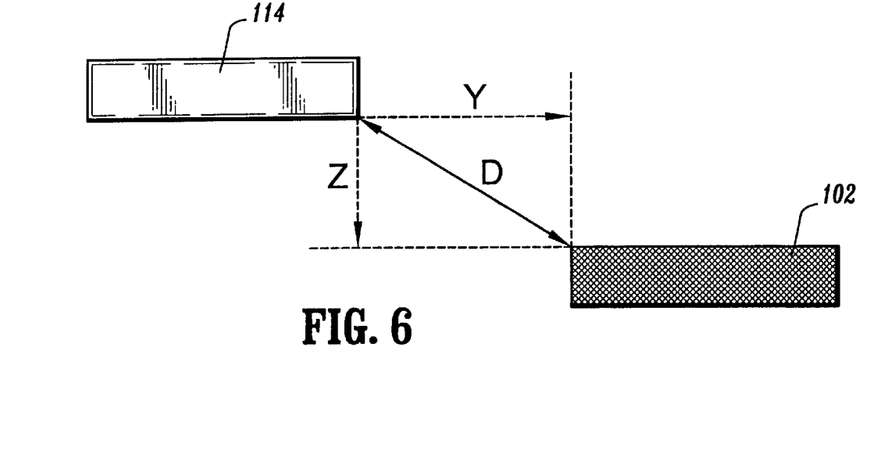
FIG. 6 is a cross-sectional view showing a distance between fuse portion 116 and terminal 102 in accordance with the present invention.

Referring to FIG. 6, a schematic cross-section taken at section line 6—6 of FIG. 5 illustratively shows fuse portion 114 and connection 102 offset in both the horizontal direction "y" (see also "y" in FIG. 5) and the vertical direction "z". Advantageously, this provides a diagonal distance "D" without having to increase fuse pitch. In this way, it is less likely that cracks from a blown fuse will reach the connections 102 of the neighboring fuse.

Figure 7:
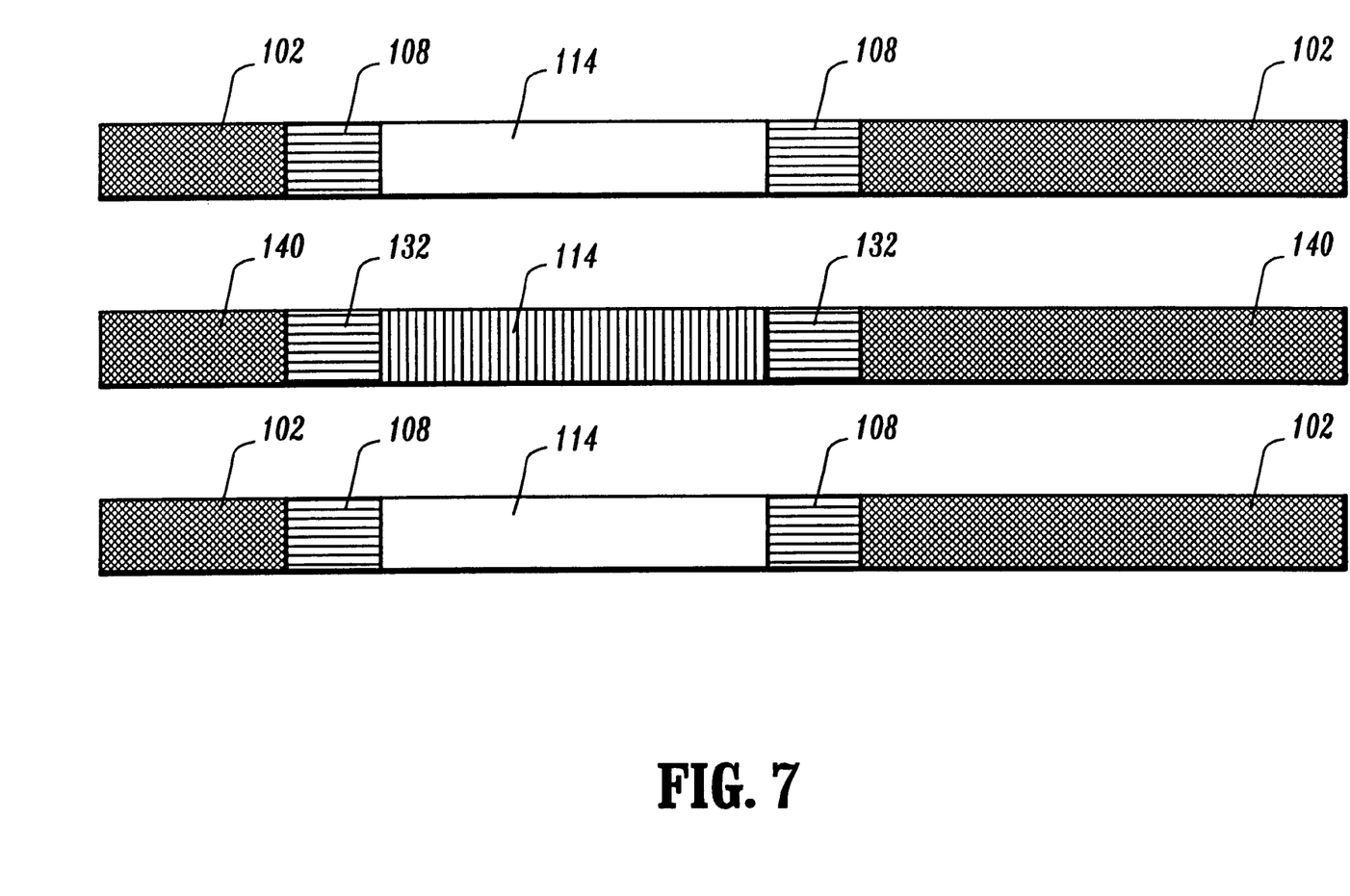
FIG. 7 is a top layout view of another embodiment of the present invention showing fuse portions on different layers.
Figure 8:
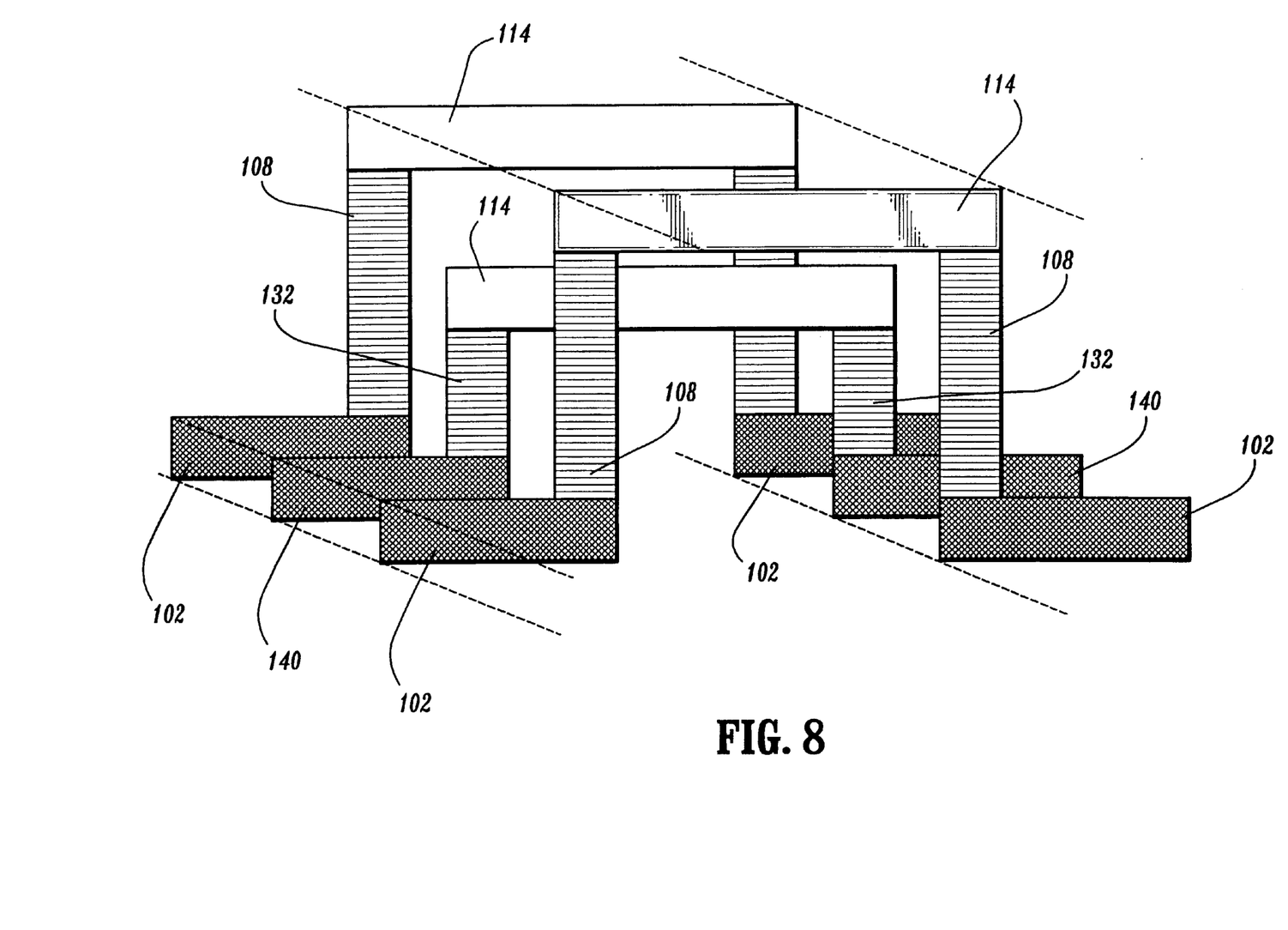
FIG. 8 is a perspective view of the embodiment of FIG. 7 showing fuse terminals on different levels in accordance with the present invention.

Referring to FIGS. 7 and 8, another embodiment of the present invention includes placing fuse portions 114 on different levels. This may be achieved by forming an additional dielectric layer (not shown) and performing the methods steps described above to form fuse portions 114 on a different level. Contacts 132 are formed down to connections 140 on a same level as connections 102, or to a different level from connections 102. Connections 102 and 140 are substantially the same in all other respects.

Fuse portions 114 may be staggered between adjacent fuses, but may also be in-line, as shown in FIG. 7, since adjacent fuse portions 114 are formed on different levels, which provides additional distance between adjacent fuse portions 114. When fuses are to be programmed, the dielectric layer covering fuses on lower levels may be opened by a masked etching process. Alternately, if fuse portions 114 and contacts 132 (and/or contacts 108) are formed from a corrosion resistant material (e.g., tungsten), then fuse 134 may be completely exposed by removing the dielectric material, which surrounds fuse 134. The fuses can then be programmed. FIG. 8 shows a middle fuse 114 lower than adjacent neighboring fuses 114.

Figure 9:
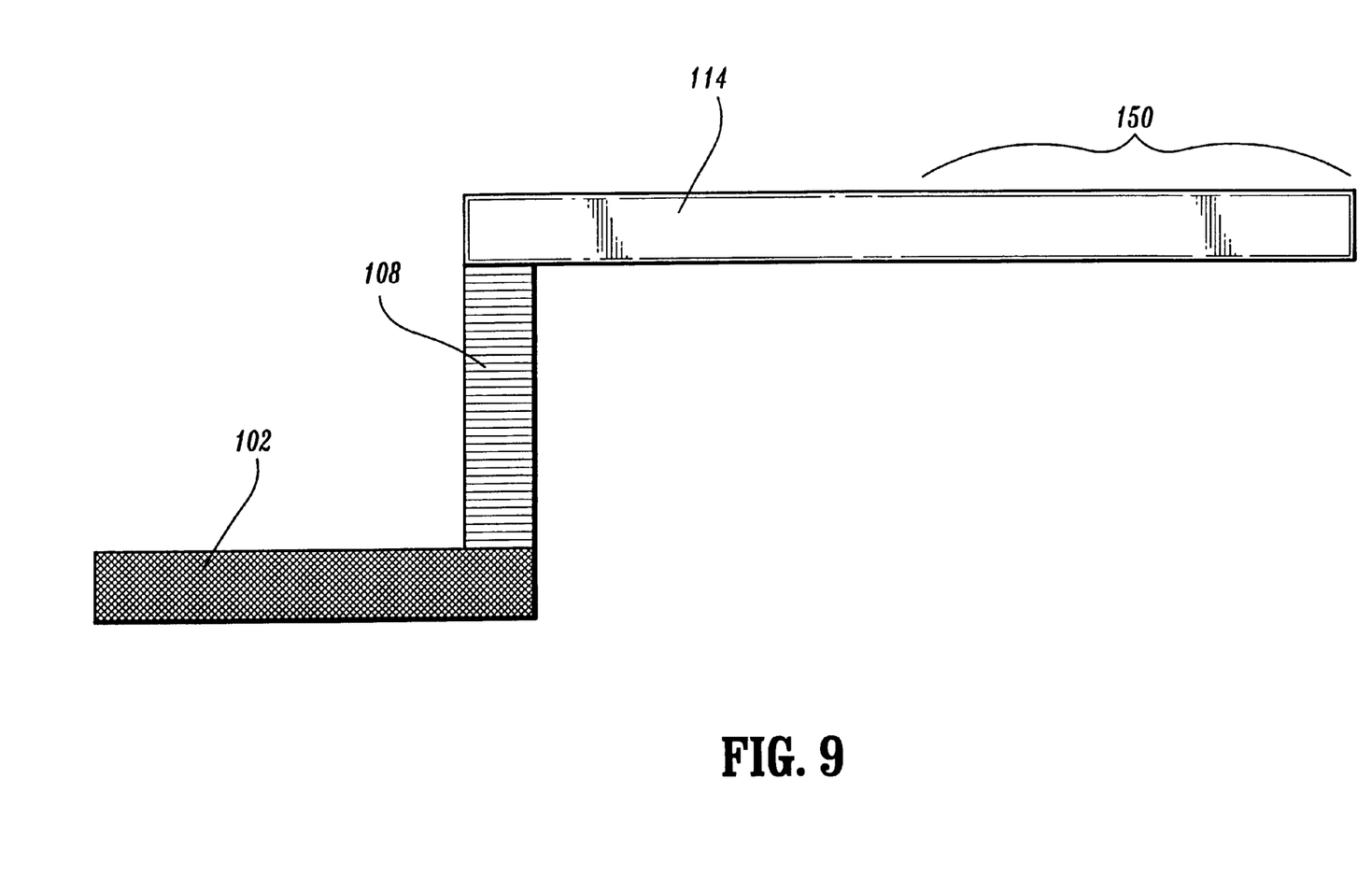
FIG. 9 is a cross-sectional view another embodiment of the present invention showing one fuse terminal on a same level as a fuse portion and one fuse terminal on a different level than the fuse portion in accordance with the present invention.
Figure 10:
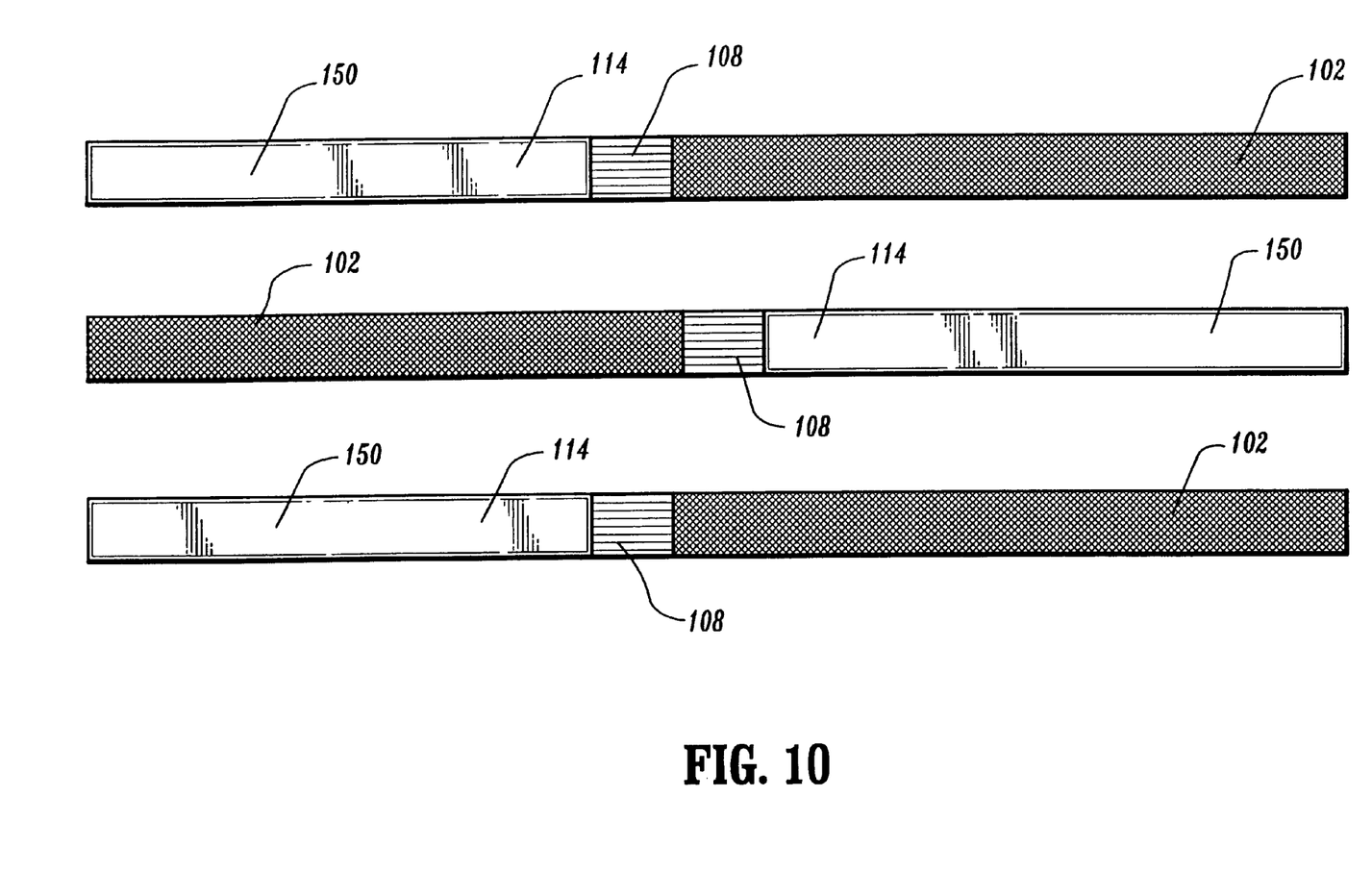
FIG. 10 is a top layout view of the embodiment shown in FIG. 9.

Referring to FIGS. 9 and 10, in another embodiment, it may be useful to include a connection or fuse terminal 150 on a same level as fuse portion 114. A second fuse terminal 102 remains on a different level, as shown in FIG. 9. In a staggered configuration as shown in FIG. 10, the adjacent connections 102 would be on a different level and therefore would remain protected when adjacent fuse portions 116 are programmed.

It is to be understood the other fuse structures may be achieved in accordance with the present invention. For example, the fuse embodiments of the present invention may be combined on a same chip, connections may be made to fuses on a plurality of different levels, multiple connections may be made to each fuse, etc.

Having described preferred embodiments for multi-level fuse structure (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor device, comprising:

a first conductor;

a second conductor;

a fuse portion disposed on a different level relative to both the first conductor and the second conductor so as to prevent damage to said first conductor or said second conductor if said fuse portion is blown;

a first contact connecting the fuse portion to the first conductor; and a second contact connecting the fuse portion to the second conductor.

2. The semiconductor device as recited in claim 1, wherein the fuse portion includes tungsten.

3. The semiconductor device as recited in claim 1, wherein the first conductor is disposed on a different level than the second conductor.

4. The semiconductor device as recited in claim 1, wherein the fuse portion is disposed in a terminal via window.

5. The semiconductor device as recited in claim 1, wherein the fuse portion includes a thermal pad.

6. A semiconductor device, comprising:

a plurality of fuses disposed in a fuse region, each fuse comprising:

a first conductor;

a second conductor;

a fuse portion disposed on a different level relative to both the first conductor and the second conductor;

a first contact connecting the fuse portion to the first conductor; and a second contact connecting the fuse portion to the second conductor;

wherein each fuse portion is offset from adjacent fuse portions so as to prevent damage to said first conductor, said second conductor or said adjacent fuse portions if any fuse portion is blown.

7. The semiconductor device as recited in claim 6, wherein the fuse portion includes tungsten.

8. The semiconductor device as recited in claim 6, wherein the first conductors are disposed on a different level than the second conductors.

9. The semiconductor device as recited in claim 6, wherein the fuse portions are disposed in a terminal via window.

10. The semiconductor device as recited in claim 6, wherein each fuse portion is next to one of the first conductor and the second conductor of adjacent fuses, and each fuse portion is disposed on a different level than the one of the first conductor and the second conductor of adjacent fuses.

11. The semiconductor device as recited in claim 6, wherein the fuse portions are formed on a plurality of different levels.

12. The semiconductor device as recited in claim 6, wherein the plurality of different levels includes two and the fuse portions alternate between the two different levels.

13. The semiconductor device as recited in claim 6, wherein the fuse portion includes a thermal pad.

14. A semiconductor device, comprising:

a plurality of fuses disposed within a terminal via window, each fuse comprising:

a first conductor;

a second conductor disposed on a level different from the first conductor;

a fuse portion disposed on a same level as the first conductor and connected to the first conductor; and a first contact connecting the fuse portion to the second conductor wherein every other fuse portion is offset to an opposite side of the terminal view from adjacent fuse portions, and every other fuse portion is adjacent to the second conductor of an adjacent fuse so as to prevent damage to said first conductor, said second conductor or said adjacent fuse portions if any fuse portion is blown.

15. The semiconductor device as recited in claim 14, wherein the fuse portion includes tungsten.

16. The semiconductor device as recited in claim 14, wherein the fuse portion includes a thermal pad.

* * * * *